(12) United States Patent
Weaver, Jr. et al.

(10) Patent No.: US 7,498,507 B2
(45) Date of Patent: Mar. 3, 2009

(54) DEVICE FOR SOLID STATE THERMAL TRANSFER AND POWER GENERATION

(75) Inventors: Stanton Earl Weaver, Jr., Northville, NY (US); Robert John Wojnarowski, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 651 days.

(21) Appl. No.: 11/081,986

(22) Filed: Mar. 16, 2005

(65) Prior Publication Data

US 2006/0207643 A1  Sep. 21, 2006

(51) Int. Cl.
*H01L 35/30* (2006.01)
*H02N 10/00* (2006.01)

(52) U.S. Cl. .................. 136/205; 310/306; 427/65; 136/200

(58) Field of Classification Search ......... 136/200–242; 427/126–128
See application file for complete search history.

(56) References Cited

U.S. PATENT DOCUMENTS

| | | | |
|---|---|---|---|
| 3,169,200 A | 2/1965 | Huffman ................. 310/4 |
| 3,702,408 A | 11/1972 | Longsderff et al. ........... 310/4 |
| 4,039,352 A | 8/1977 | Marinesu ................... 136/205 |
| 4,492,809 A | 1/1985 | Dahlberg .................. 136/212 |
| 4,624,865 A * | 11/1986 | Gindrup et al. .......... 427/126.2 |
| 4,667,126 A | 5/1987 | Fitzpatrick ................ 310/306 |
| 4,755,350 A | 7/1988 | Kennel ....................... 376/321 |
| 5,028,835 A | 7/1991 | Fitzpatrick ................. 313/14 |
| 5,219,516 A | 6/1993 | Horner-Richardson et al. ... 376/321 |
| 5,492,570 A | 2/1996 | Horner-Richardson et al. ... 136/200 |
| 5,541,464 A | 7/1996 | Johnson et al. ............. 310/306 |
| 5,637,946 A | 6/1997 | Bushman ................... 310/306 |
| 5,675,972 A | 10/1997 | Edelson ........................ 62/3.1 |
| 5,973,259 A | 10/1999 | Edelson ..................... 136/254 |
| 5,994,638 A | 11/1999 | Edelson ..................... 136/205 |
| 6,037,697 A | 3/2000 | Begg et al. ................. 310/306 |
| 6,064,137 A | 5/2000 | Cox ........................... 310/306 |
| 6,084,173 A | 7/2000 | DiMatteo ................... 136/201 |
| 6,100,621 A | 8/2000 | Rasor et al. ................ 310/306 |
| 6,229,083 B1 | 5/2001 | Edelson ..................... 136/201 |

(Continued)

FOREIGN PATENT DOCUMENTS

EP    0706196 B1    3/2000

(Continued)

OTHER PUBLICATIONS

Vu Thien Binh and Ch. Adessi; New Mechanism for Electron Emission from Planar Cold Cathodes: The Solid-State Field-Controlled Electron Emitter; vol. 85, No. 4; pp. 864-867,; Jul. 24, 2000.

*Primary Examiner*—Alexa D Neckel
*Assistant Examiner*—Shannon Gardner
(74) *Attorney, Agent, or Firm*—Patrick K. Patnode (57) ABSTRACT

A solid state thermal transfer device includes first and second electrically conductive substrates that are positioned opposite from one another. The solid state thermal transfer device also includes a sealing layer disposed between the first and second electrically conductive substrates and a plurality of hollow structures having a conductive material, wherein the plurality of hollow structures is contained by the sealing layer between the first and second electrically conductive substrates.

18 Claims, 10 Drawing Sheets

U.S. PATENT DOCUMENTS

| | | | |
|---|---|---|---|
| 6,232,546 B1 | 5/2001 | DiMatteo et al. | 136/253 |
| 6,281,514 B1 | 8/2001 | Tavkhelidze | 250/493.1 |
| 6,294,858 B1 | 9/2001 | King et al. | 310/306 |
| 6,384,312 B1 | 5/2002 | Ghoshal et al. | 136/203 |
| 6,396,191 B1 | 5/2002 | Hagelstein et al. | 310/306 |
| 6,407,477 B1 | 6/2002 | King et al. | 310/306 |
| 6,417,060 B2 | 7/2002 | Tavkhelidze et al. | 438/380 |
| 6,467,275 B1 | 10/2002 | Ghoshal | 136/204 |
| 6,489,704 B1 | 12/2002 | Kucherov et al. | 310/306 |
| 6,494,048 B1 | 12/2002 | Ghoshal et al. | 62/3.7 |
| 6,495,843 B1 | 12/2002 | Tavkelidze | 250/493.1 |
| 6,509,669 B1 | 1/2003 | King et al. | 310/306 |
| 6,531,703 B1 | 3/2003 | Tavkhelidze | 250/493.1 |
| 6,608,250 B2 | 8/2003 | Ghoshal | 136/201 |
| 6,625,990 B2 | 9/2003 | Bell | 62/3.3 |
| 6,651,760 B2 | 11/2003 | Cox et al. | 180/65.3 |
| 6,720,704 B1 | 4/2004 | Tavkhelidze et al. | 310/306 |
| 2001/0046749 A1 | 11/2001 | Tavkhelidze et al. | 438/380 |
| 2002/0166839 A1 | 11/2002 | Ghoshal et al. | 216/11 |
| 2002/0170172 A1 | 11/2002 | Tavkhelidze et al. | 29/842 |
| 2003/0033818 A1 | 2/2003 | Kucherov et al. | 136/204 |
| 2003/0042819 A1* | 3/2003 | Martinovsky et al. | 310/306 |
| 2003/0068431 A1 | 4/2003 | Taliashvili et al. | 427/58 |
| 2003/0184188 A1 | 10/2003 | Kucherov et al. | 310/306 |
| 2004/0029341 A1 | 2/2004 | Cox et al. | 428/237 |
| 2004/0031514 A1 | 2/2004 | Bell | 136/203 |
| 2004/0050415 A1 | 3/2004 | Kucherov et al. | 136/252 |

FOREIGN PATENT DOCUMENTS

| | | |
|---|---|---|
| WO | WO9913562 A1 | 3/1999 |
| WO | WO9940628 A1 | 8/1999 |
| WO | WO0059047 A1 | 10/2000 |
| WO | WO0139235 A2 | 5/2001 |
| WO | WO0169657 A2 | 9/2001 |
| WO | WO03021663 A1 | 3/2003 |
| WO | WO03021758 A2 | 3/2003 |
| WO | WO03083177 A2 | 10/2003 |
| WO | WO03090245 A1 | 10/2003 |
| WO | WO2004036724 A2 | 4/2004 |

* cited by examiner

DEVICE FOR SOLID STATE THERMAL TRANSFER AND POWER GENERATION

BACKGROUND

The invention relates generally to thermal transfer devices, and particularly, to solid-state thermal transfer devices.

Thermal transfer devices may be used for a variety of heating/cooling and power generation/heat recovery systems, such as refrigeration, air conditioning, electronics cooling, industrial temperature control, waste heat recovery, and power generation. These thermal transfer devices are also scalable to meet the thermal management needs of a particular system and environment. Unfortunately, existing thermal transfer devices, such as those relying on refrigeration cycles, are relatively inefficient and environmentally unfriendly due to mechanical components such as compressors and the use of refrigerants.

In contrast, solid-state thermal transfer devices offer certain advantages, such as the potential for higher efficiencies, reduced size and weight, reduced noise, and being more environmentally friendly. For example, thermotunneling devices transfer heat by tunneling hot electrons from one electrode to another electrode across a nanometer-scale barrier. The heat transfer efficiency of these thermotunneling devices depends upon various factors, such as material characteristics (e.g., electrodes and barrier), electrode alignment, electrode spacing, and thermal losses. For example, the efficiency of these thermotunneling devices generally improves if the electrodes have a low work function, the barrier is in vacuum or an inert gas, and the spacing between the electrodes is less than about 50 nanometers. Unfortunately, electrode spacing is particularly difficult to achieve and maintain in these thermotunneling devices. Thus, achieving efficient thermotunneling devices can be problematic.

Certain other solid-state thermal devices, such as thermoelectric devices, transfer heat by flow of electrons through pairs of p-type and n-type semiconductor thermoelements forming thermocouples that are connected electrically in series and thermally in parallel. The heat transfer efficiency of these thermoelectric devices depends on the Seebeck coefficient, the electrical conductivity, and the thermal conductivity of the thermoelectric materials employed for such devices. For example, the efficiency of these devices generally improves if the thermal conductivity of the thermoelectric material is low (less than about 10E-3 W/cmK). Unfortunately, these devices have a relatively low efficiency (of the order of 2-3%,) due to the relatively high thermal conductivity (greater than about 20E-3) of the thermoelectric materials such as skutterudite based thermoelectric materials. Thus, achieving efficient thermoelectric devices can be problematic.

Accordingly, a need exists for creating a thermal transfer device with low work function electrodes and a controlled spacing between the electrodes. Furthermore, it would be desirable to create a thermal transfer device with low thermal conductivity.

BRIEF DESCRIPTION

In accordance with certain embodiments, the present technique has a device including first and second electrically conductive substrates that are positioned opposite from one another. The device also includes a sealing layer disposed between the first and second electrically conductive substrates and a plurality of hollow structures having a conductive material, wherein the plurality of hollow structures is contained by the sealing layer between the first and second electrically conductive substrates.

In accordance with certain embodiments, the present technique has a device including first and second thermally and electrically conductive substrates that are positioned opposite from one another, wherein the first and second thermally and electrically conductive substrates are each substantially flat. The device includes an electrical barrier layer disposed between the first and second thermally and electrically conductive substrates on the first or second thermally and electrically conductive substrates and a sealing layer disposed between the first and second thermally and electrically conductive substrates. The device also includes a plurality of hollow structures having an electrically conductive material, wherein the plurality of hollow structures is contained by the sealing layer between the first and second thermally and electrically conductive substrates.

In accordance with certain embodiments, a method of manufacturing a device includes providing first and second electrically conductive substrates and providing a sealing layer between the first and second electrically conductive substrates. The method includes disposing a plurality of hollow structures on the sealing layer between the first and second electrically conductive substrates in a configuration in which the first and second electrically conductive substrates are positioned opposite each other, wherein each of the plurality of hollow structures comprises a conductive material. The method also includes bonding the first and second electrically conductive substrates in the configuration.

In accordance with certain embodiments, the present technique has a method of operation of a thermal transfer device including passing hot electrons through a conductive material of a plurality of hollow structures between first and second thermally conductive substrates.

In accordance with certain embodiments, the present technique has a method of operation of a power generation device including generating power by substantially maintaining a temperature gradient between first and second electrically conductive substrates through a conductive material of a plurality of hollow structures disposed between the first and second electrically conductive substrates.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
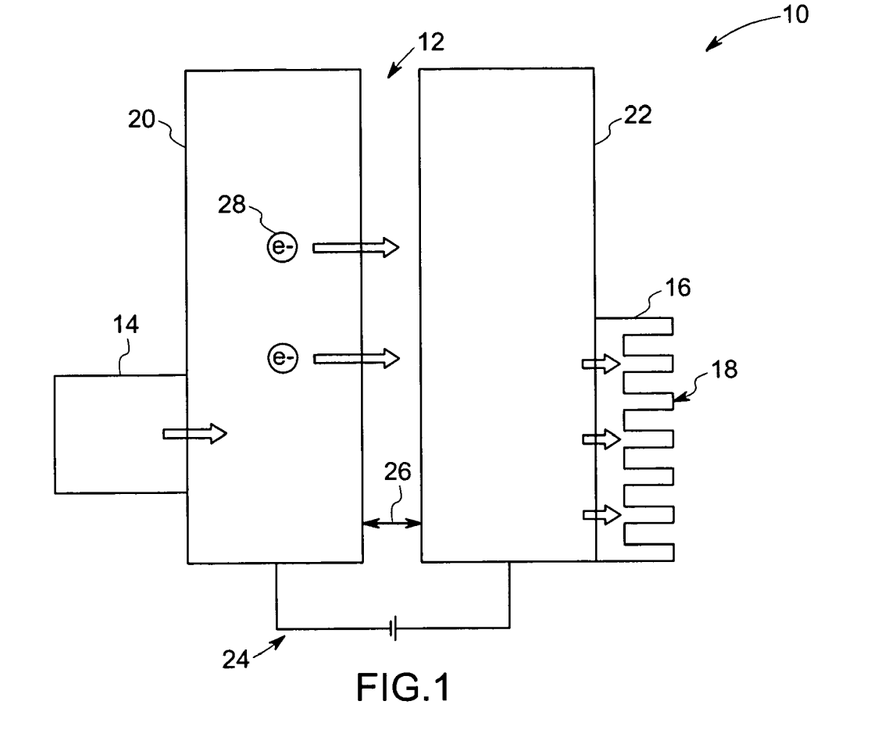
FIG. 1 is a diagrammatical illustration of a system having a thermal transfer device in accordance with embodiments of the present technique.

Referring now to the drawings, FIG. 1 illustrates a system 10 having a thermal transfer device in accordance with certain embodiments of the present technique. As illustrated, the system 10 includes a thermal transfer device 12 that transfers heat from an area or object 14 to another area or object, such as a heat sink 16, which heat sink 16 then dissipates the heat via fins 18. One or more fans also may be disposed adjacent the heat sink 16 to force airflow and, thus, increase convective heat transfer away from the fins 18. In this embodiment, the thermal transfer device 12 is a thermotunneling-based device. Alternatively, the thermal transfer device 12 may be a thermoelectric device as described below with reference to FIG. 4. More specifically, the disclosed embodiments include a plurality of hollow structures, such as conductive hollow spheres, disposed within an electrode gap of the thermal transfer device. These hollow structures are described in detail below with reference to FIGS. 9-14.

The thermal transfer device 12 illustrated in FIG. 1 comprises a first electrode 20 thermally coupled to the object 14 and a second electrode 22 that is thermally coupled to the heat sink 16. Further, an input voltage source 24 is coupled to the first electrode 20 and the second electrode 22. In operation, the input voltage source 24 provides a flow of current through the first and second electrodes 20 and 22, thereby creating a flow of hot electrons 28 between the electrodes 20 and 22 across a thermotunneling gap 26. In this embodiment, the flow of current via the input voltage source 24 enables hot electrons 28 to leave their orbit and tunnel across the thermotunneling gap 26, thus transporting heat. As a result of this tunneling flow of hot electrons 28, the thermotunneling device 12 facilitates heat transfer away from the object 14 towards the heat sink 16. At the heat sink 16, the fins 18 facilitate heat transfer away from the system 10.

In this embodiment, the thermotunneling gap 26 is formed by vacuum that provides a minimum thermal back path to enhance the efficiency of the thermotunneling device 12. In certain embodiments, the thermotunneling gap 26 has a spacing ranging between approximately 1 nanometer to about 20 nanometers. The nanometer gap between the first and second electrodes 20 and 22 facilitates a substantial reduction in the tunneling of cold electrons across the thermotunneling gap and facilitates a substantial increase in the tunneling of hot electrons across the thermotunneling gap 26. Further, the nanometer gap between the first and second electrodes 20 and 22 advantageously reduces a high voltage requirement across the first and second electrodes 20 and 22 for facilitating the tunneling of electrons. Thus, a nanometer gap between the first and second electrodes 20 and 22 enables the tunneling of electrons at a relatively lower voltage, thereby enhancing the efficiency of the thermotunneling device 12.

The nanometer spacing and a bias voltage across the thermotunneling gap 26 ensure that the heat flow is substantially unidirectional. In the illustrated embodiment, the heat flow is unidirectional from the object 14 towards the heat sink 16, thus making the object 14 cooler by transferring the heat to the heat sink 16. It should be noted that the thermotunneling device 12 may be operable at or near room temperature. In certain embodiments, the first and second electrodes 20 and 22 comprise dissimilar materials that enhance the tunneling of electrons because of a peltier effect, thereby enhancing the efficiency of the thermotunneling device 12. However, the direction of current flow may be selected based upon a desired direction of the thermotunneling of electrons between the first and second electrodes 20 and 22.

Figure 2:
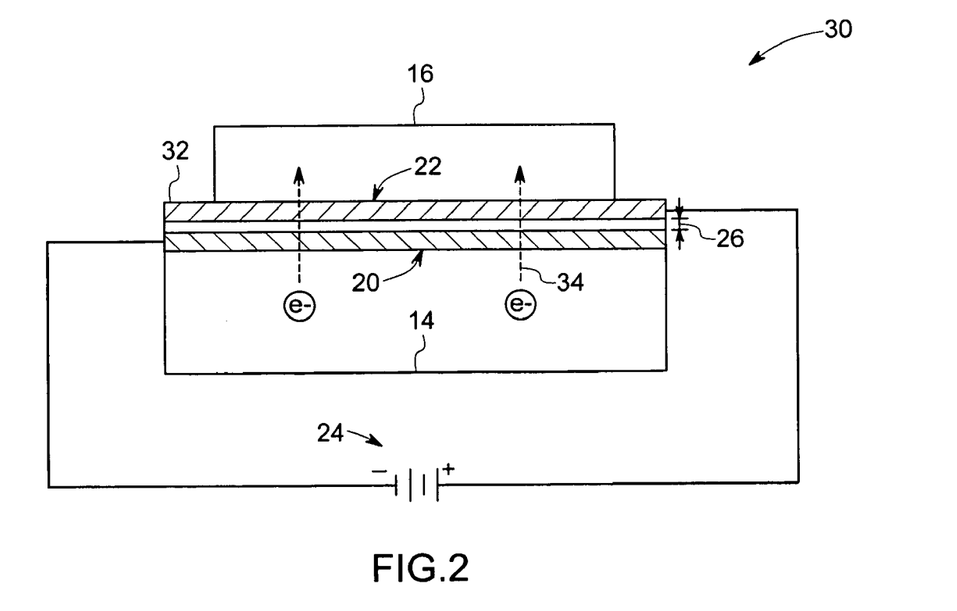
FIG. 2 is a diagrammatical illustration of a cooling system having a thermal transfer device in accordance with embodiments of the present technique.

FIG. 2 illustrates a cooling system 30 having a thermal transfer device, such as a thermotunneling device 32, in accordance with embodiments of the present technique. The thermotunneling device 32 comprises the first electrode 20 and the second electrode 22 separated by the thermotunneling gap 26. As illustrated, the first electrode 20 is thermally coupled to the object/area 14 and the second electrode 22 is thermally coupled to the object/area 16. Further, the first electrode 20 and the second electrode 22 are coupled to the input voltage source 24 with the polarity as shown in FIG. 2. In operation, the input voltage source 24 activates the thermotunneling device 32 at a pre-determined tunneling current. As the current flows from the first electrode 20 to the second electrode 22, the thermotunneling device 32 forces electrons to move from the object 14 toward the object 16 in a direction 34 over the thermotunneling gap 26. The movement of electrons in the direction 34 transfers heat away from the object 14, across the gap 26, and into the object 16, wherein the heat is further transferred away from the system 30. Advantageously, this thermotunneling-based heat transfer cools the object 14.

Figure 3:
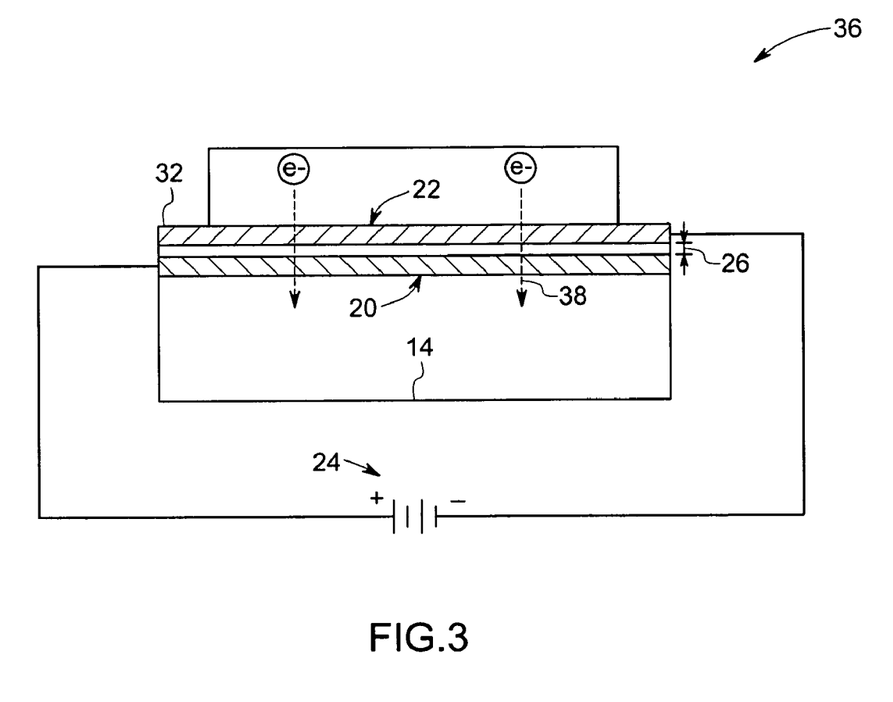
FIG. 3 is a diagrammatical illustration of a heating system having a thermal transfer device in accordance with embodiments of the present technique.

FIG. 3 illustrates a heating system 36 having the thermotunneling device 32 in accordance with embodiments of the present technique. As described above, the thermotunneling device 32 includes the two electrodes 20 and 22 that are thermally coupled to the objects 14 and 16, respectively. In addition, the thermotunneling device 32 is coupled to the input voltage source 24. As illustrated, the polarity of the input voltage source 24 in the heating system 36 is reversed as compared to the cooling system 30 as shown in FIG. 2. This enables the electrons to flow from the object 16 to the object 14 in a direction 38, thus heating the object 14 by transferring heat from the object 16 to the object 14. As described above, the thermotunneling device 32 may be employed for heating or cooling of objects 14 and 16. In certain embodiments, the thermotunneling device 32 may be employed for power generation by maintaining a temperature gradient between the first and second objects 14 and 16, respectively.

Figure 4:
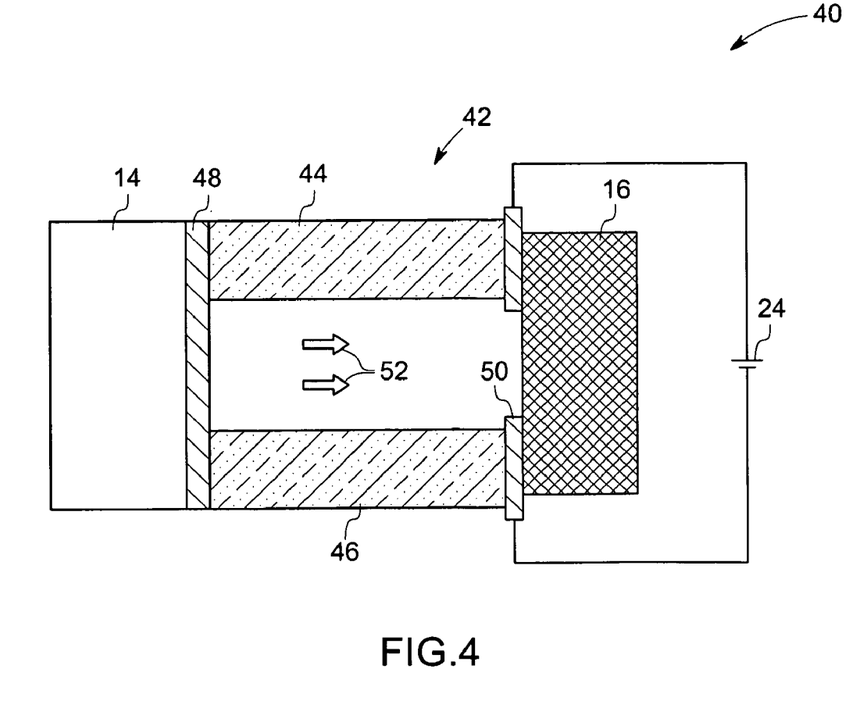
FIG. 4 is a diagrammatical illustration of a system having a thermoelectric device in accordance with embodiments of the present technique.

Referring now to FIG. 4, a system 40 having a thermoelectric-based thermal transfer device 42 is illustrated. The thermoelectric device 42 comprises an n-type semiconductor 44 and a p-type semiconductor 46 that function as thermoelements for transferring heat away from the object 14 towards the heat sink 16. In this embodiment, the n-type and p-type semiconductors 44 and 46 are disposed on substrates 48 and 50 that are coupled to the first and second objects 14 and 16, respectively. In certain embodiments, a plurality of pairs of n-type and p-type semiconductors 44 and 46 may be used to form thermocouples that are connected electrically in series and thermally in parallel for facilitating the heat transfer. In operation, the input voltage source 24 provides a flow of current through the n-type and p-type semiconductors 44 and 46. As a result, the positive and negative charge carriers absorb heat energy from the first substrate 48 and release the heat energy towards the second substrate 50. Thus, the thermoelectric device 42 facilitates heat transfer away from the object 14 towards the heat sink 16 by a flow of charge carriers 52 between the first and second substrates 48 and 50. In certain embodiments, the polarity of the input voltage source 24 in the system 40 may be reversed to enable the charge carriers to flow from the object 16 to the object 14, thus heating the object 14 by transferring heat from the object 16 to the object 14. As described above, the thermoelectric device 42 may be employed for heating or cooling of objects 14 and 16. In certain embodiments, the thermoelectric device 42 may be employed for power generation by maintaining a temperature gradient between the first and second objects 14 and 16, respectively. The thermal transfer devices 32 and 42 as described above may be fabricated by a variety of techniques, such as the exemplary techniques described in detail below with reference to FIGS. 5 and 6.

Figure 5:
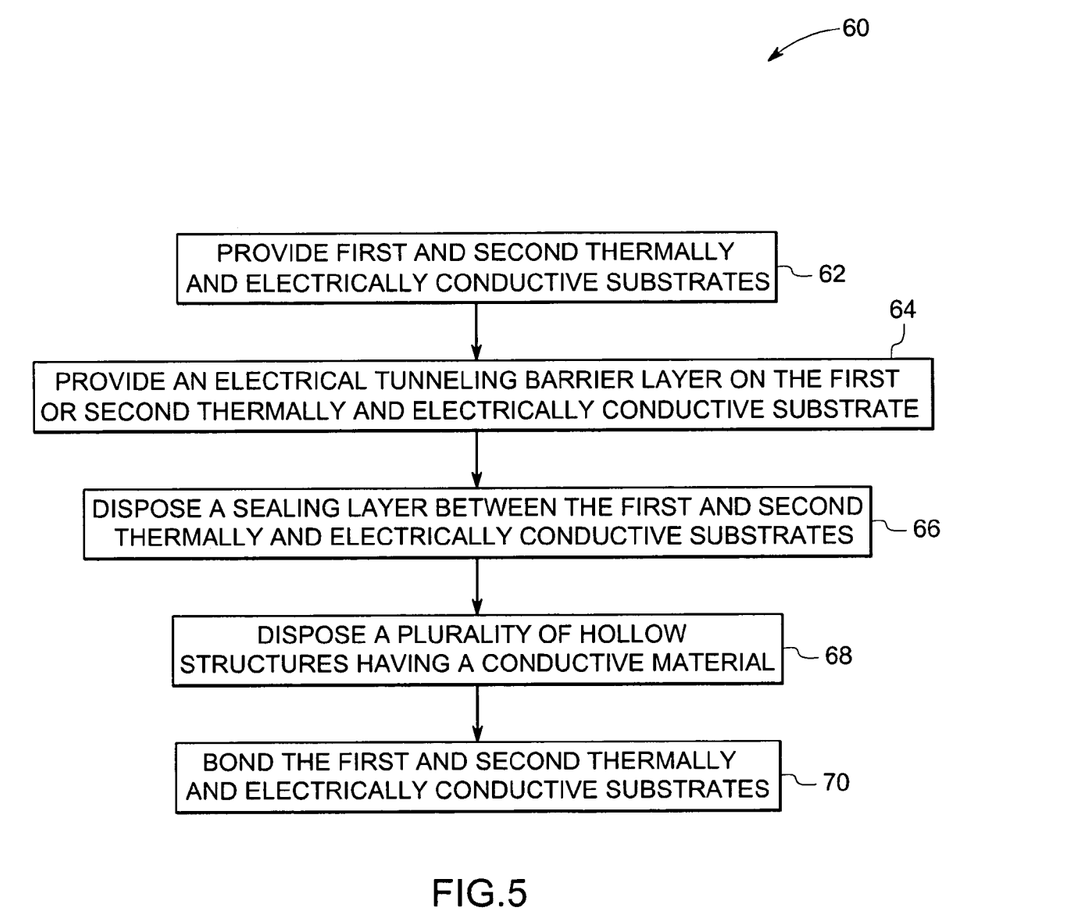
FIG. 5 is a flow chart illustrating a method of manufacturing a thermotunneling device in accordance with an embodiment of the present technique.

Referring first to FIG. 5, a flow chart illustrates an exemplary process 60 for manufacturing the thermotunneling-based thermal transfer device 32 of FIGS. 1, 2 and 3 in accordance with embodiments of the present technique. The process 60 begins by providing first and second thermally and electrically conductive substrates (block 62). In this embodiment, the first and second thermally and electrically conductive substrates comprise substantially flat materials or structures. For example, highly doped n-type silicon wafers may be used for the first and second thermally and electrically conductive substrates. Alternatively, highly doped p-type silicon wafers may be used for the first and second thermally and electrically conductive substrates. In certain embodiments, the first and second thermally and electrically conductive substrates comprise an electrically insulating substrate having an electrically conductive coating disposed on the electrically insulating substrate. In some other embodiments, highly polished thermally and electrically conductive metals may be employed for the first and second thermally and electrically conductive substrates. Examples of such metals include aluminum, copper, nickel, and alloys thereof.

At block 64, the process 60 continues by providing an electrical tunneling barrier layer on the first or second thermally and electrically conductive substrate. In certain embodiments, the electrical barrier layer is provided on the first and second thermally and electrically conductive substrates. The electrical barrier layer may be grown or deposited on the first thermally and electrically conductive substrate by techniques such as thermal oxidation, chemical vapor deposition, enhanced plasma assisted chemical vapor deposition, sputtering, evaporation and spin coating. In certain embodiments, the thickness of the electrical barrier layer is about 1 nanometer to about 20 nanometers. In certain embodiments, the electrical barrier layer comprises a material having a low thermal conductivity. Examples of such materials include oxides, polymers, nitrides, and silica-based aerogels.

Next, a sealing layer is disposed on the electrical barrier layer between the first and second thermally and electrically conductive substrates (block 66). In this embodiment, the sealing layer includes a plurality of hollow shapes, e.g. hollow rectangular shapes or frame-like patterns, disposed on the sealing layer. Examples of the sealing layer include low thermally conducting materials such as glasses and polymer resins. Alternatively, metals or solders may be used as the sealing layer. In certain embodiments, a preform of the sealing layer having a plurality of hollow shapes may be disposed on the first thermally and electrically conductive substrate. Moreover, the process 60 includes disposing a plurality of hollow structures, e.g., spheres, ovals, triangles, cubic structures, or other curved or multi-sided structures, on the sealing layers (block 68). In this embodiment, each of the plurality of hollow structures includes an electrically conductive material. For example, certain embodiments of the hollow structures are entirely conductive, while other embodiments include a conductive coating or layer. In one embodiment, the hollow structures comprise hollow glass spheres. However, thermally conductive particles of other sizes and shapes are within the scope of the present technique. Further, multiple hollow structures may be disposed within each of the plurality of hollow shapes on the sealing layer. In certain embodiments, the electrically conductive material is coated or doped on the hollow structures by techniques such as sputtering, chemical vapor deposition, enhanced plasma assisted chemical vapor deposition and so forth. Examples of electrically conductive materials include metals such as gold and nickel.

In certain other embodiments, the plurality of hollow structures having the conductive material may be disposed in a plurality of layers between the first and second thermally and electrically conductive substrates for meeting the thermal needs of an environment. Further, another thermally and electrically conductive substrate may be disposed between successive layers of the hollow structures between the first and second thermally and electrically conductive substrates.

Moreover, the process 60 includes bonding the first and second thermally and electrically conductive substrates in a wafer bonder (block 70). In certain embodiments, the first and second thermally and electrically conductive substrates are placed inside a vacuum chamber and are bonded at a desired temperature. The temperature inside the vacuum chamber may be raised to melt the sealing layer and subsequently the bonded structure may be cooled while maintaining vacuum. Additionally, anodic bonding may be used to bond the structure. In certain embodiments, pressure and temperature within the vacuum chamber may be adjusted to provide a slight deformation of the hollow structures during bonding to provide a relatively larger tunneling area. In certain embodiments, a low work function material may be introduced to coat the inside surfaces of the assembled device. In various embodiments, the low work function material may comprise an alkalide, an electride, a rare-earth sulfide, an oxide of barium, strontium, calcium and their combinations thereof. The first and second thermally and electrically conductive substrates may be bonded in a configuration in which the first and second thermally and electrically conductive substrates are positioned opposite from one another.

In certain embodiments, a plurality of units having opposite sections of bonded first and second thermally and electrically conductive substrates are extracted to form a plurality of thermal transfer devices. Each of these extracted units has a plurality of hollow structures having the thermal conductive material disposed between the first and second thermally and electrically conductive substrates. The extracted units may be coupled electrically and assembled, as a thermal transfer module to provide a desired heating or cooling capacity based on certain thermal management needs.

Figure 6:
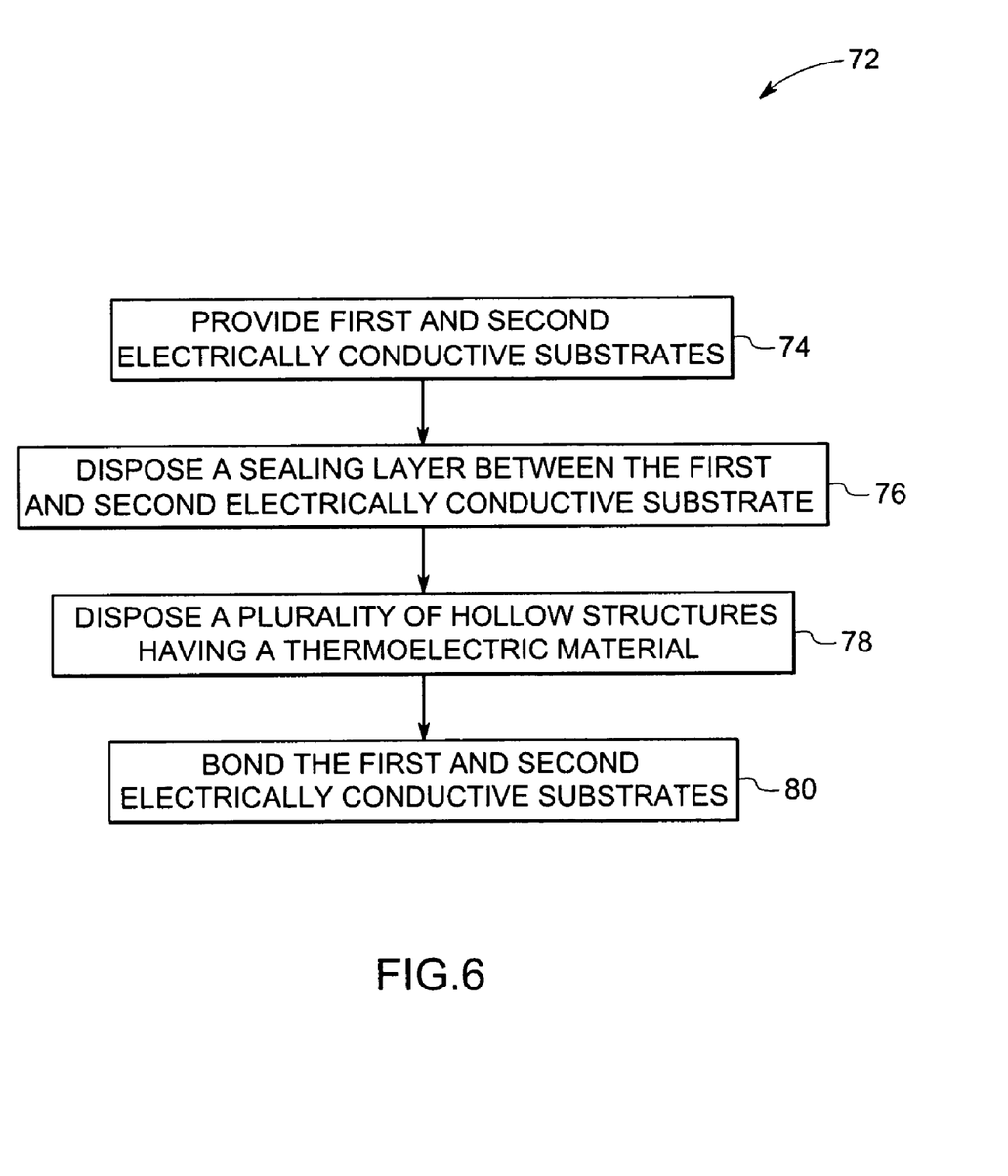
FIG. 6 is a flow chart illustrating a method of manufacturing a thermoelectric device in accordance with an embodiment of the present technique.

Turning now to FIG. 6, a flow chart illustrates an exemplary process 72 of manufacturing the thermoelectric-based thermal transfer device of FIG. 4 in accordance with embodiments of the present technique. The process 72 begins by providing first and second electrically conductive substrates (block 74). For example, doped n-type silicon wafers may be used for the first and second electrically conductive substrates. Alternatively, doped p-type silicon wafers may be used for the first and second electrically conductive substrates. In certain embodiments, the first and second electrically conductive substrates comprise a metal. Examples of such metals include aluminum, copper, nickel, and alloys thereof. Further, the first and second electrically conductive substrates may be of variety of shapes such as flat planar, hemispheric, tubular and so forth.

Next, at block 76 a sealing layer is disposed between the first and second electrically conductive substrates. In one embodiment, the sealing layer includes a plurality of hollow shapes disposed on the sealing layer. Examples of the sealing layer include low thermally conducting materials such as glasses or polymer resins. Alternatively metals or solders may be used as the sealing layer. In certain embodiments, a preform of the sealing layer having a plurality of hollow shapes may be disposed on the first electrically conductive substrate. Moreover, the process 72 includes disposing a plurality of hollow structures, e.g., spheres, ovals, triangles, cubic structures, or other curved or multi-sided structures, internal to the sealing layers (block 78). In this embodiment, each of the plurality of hollow structures includes a thermoelectric material. For example, certain embodiments of the hollow structures are entirely composed of a thermoelectric material, while other embodiments include a thermoelectric coating or layer. In this embodiment, the hollow structures comprise hollow glass spheres. Further, multiple hollow structures may be disposed within each of the plurality of hollow shapes on the sealing layer. Examples of thermoelectric materials include silicon germanium, bismuth antimony, lead telluride, bismuth telluride, or combinations thereof.

In this embodiment, a doping level of the thermoelectric material on the hollow structures is adjusted to form a p-type hollow structure or an n-type hollow structure. Further, the thickness of the doped or coated thermoelectric material may be adjusted to provide a desired electrical conductivity while maintaining a relatively low thermal resistivity. In certain embodiments, additional layers of the thermoelectric material having stepped work functions may be deposited on the hollow structures. In certain other embodiments, the size of the hollow structures and the thickness of the thermoelectric material may be adjusted to substantially reduce thermal transmission due to phonon transport via the thermoelectric material. In certain embodiments, an electrical barrier layer may be disposed on the first and second electrically conductive substrates to enable thermotunneling-based heat transfer in addition to the thermoelectric heat transfer, thereby enhancing the efficiency of the device.

In certain other embodiments, the plurality of hollow structures having the thermoelectric material may be disposed in a plurality of layers between the first and second electrically conductive substrates for meeting the thermal needs of an environment. Further, another electrically conductive substrate may be disposed between successive layers of the hollow structures.

Moreover, the process 72 includes bonding the first and second electrically conductive substrates in a wafer bonder (block 80). In certain embodiments, the first and second electrically conductive substrates are placed inside a vacuum chamber and are bonded at a desired temperature. The temperature inside the vacuum chamber may be raised to melt the sealing layer and subsequently the bonded structure may be cooled while maintaining vacuum. Additionally, anodic bonding may be used to bond the structure. In certain embodiments, layers of alternating hollow structures types may be assembled into a single device for enhanced heat transfer performance. In certain embodiments, pressure and temperature within the vacuum chamber may be adjusted to provide a slight deformation of the hollow structures during bonding to provide a relatively higher conductivity. In certain embodiments, a low work function material may be introduced to coat the inside surfaces of the assembled device. In various embodiments, the low work function material may comprise an alkalide, an electride, a rare-earth sulfide, an oxide of barium, strontium, calcium and their combinations thereof. The first and second electrically conductive substrates may be bonded in a configuration in which the first and second electrically conductive substrates are positioned opposite from one another.

In certain embodiments, a plurality of units having opposite sections of bonded first and second electrically conductive substrates is extracted to form a plurality of thermal transfer devices. Each of these extracted units has a plurality of hollow structures having the thermoelectric material disposed between the first and second electrically conductive substrates. The extracted units may be coupled electrically and assembled, as a thermal transfer module having alternating p-type and n-type legs to provide a desired heating or cooling capacity based on certain thermal management needs. Additionally, modules may be constructed from units containing both p and n type hollow coated structures.

Figure 7:
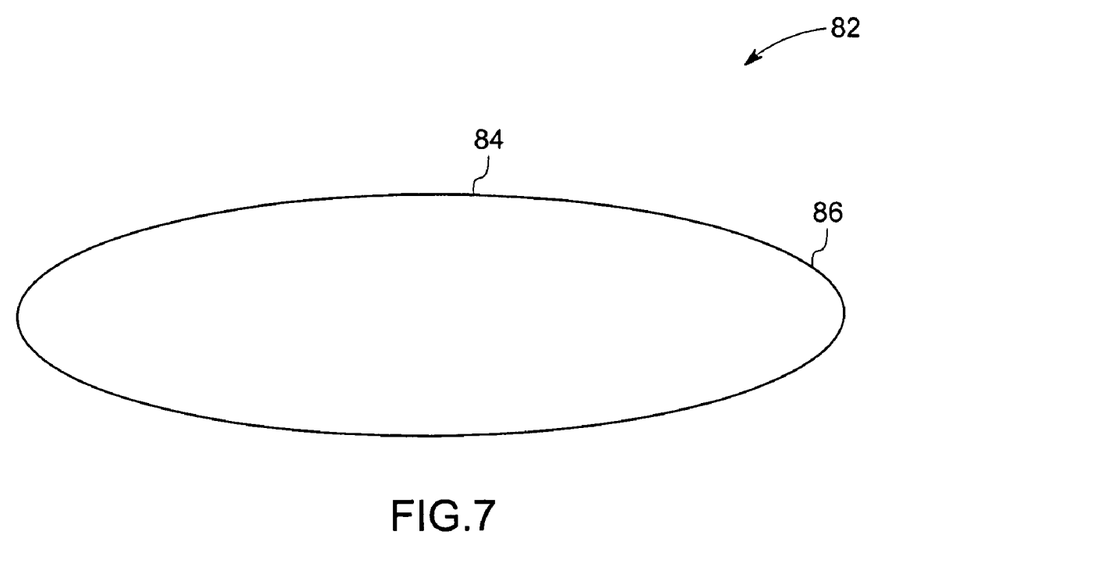
FIG. 7 is a diagrammatical top view illustrating a substrate having an electrical barrier layer for use in a thermal transfer device in accordance with embodiments of the present technique.

FIGS. 7-10 illustrate components of the thermal transfer devices of FIGS. 1, 2, 3 and 4 fabricated by the techniques described in FIGS. 5 and 6 in accordance with certain embodiments of the present technique. Referring now to FIG. 7, this figure illustrates an exemplary configuration 82 illustrating a first thermally and electrically conductive substrate 84 having an electrical barrier layer 86 for use in a thermal transfer device. In certain embodiments, the first thermally and electrically conductive substrate 84 comprises a doped n-type silicon wafer, a doped p-type silicon wafer, or a highly polished thermally and electrically conductive metallic substrate. For example, an aluminum hard drive disc blank may be used as the first thermally and electrically conductive substrate 84.

Further, the substrate 84 may comprise an electrically insulating substrate having an electrically conductive coating disposed on the electrically insulating substrate. In certain embodiments, the electrical barrier layer 86 provides a tunneling barrier for the flow of electrons in a thermotunneling-based thermal transfer device. In certain other embodiments, the electrical barrier layer 86 may be employed to enhance the heat transfer efficiency of a thermoelectric-based thermal transfer device. The electrical barrier layer 86 may be grown or deposited on the first thermally and electrically conductive substrate 84 by techniques such as thermal oxidation, chemical vapor deposition, enhanced plasma assisted chemical vapor deposition, sputtering, evaporation and spin coating. In certain embodiments, the thickness of the electrical barrier layer 86 is about 1 nanometer to about 20 nanometers. In certain embodiments, the electrical barrier layer 86 comprises a material having a low thermal conductivity. Examples of such materials include oxides, polymers, nitrides, and silica-based aerogels.

Figure 8:
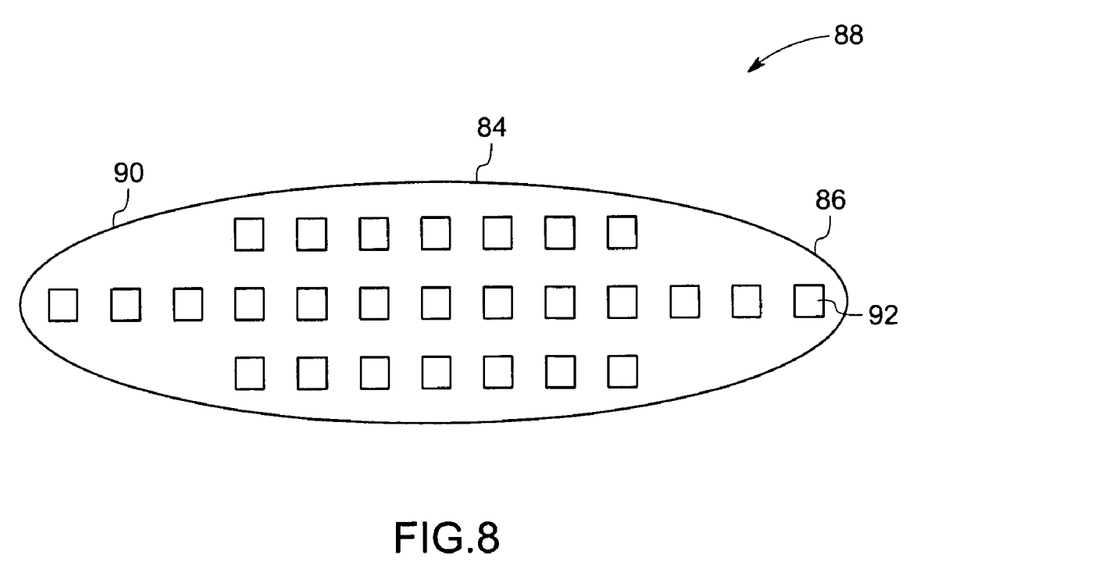
FIG. 8 is a diagrammatical top view illustrating the substrate of FIG. 7 having a sealing layer with a plurality of hollow shapes for use in a thermal transfer device in accordance with embodiments of the present technique.

FIG. 8 illustrates a sealing pattern 88 on the substrate 84 of FIG. 7 in accordance with embodiments of the present technique. The sealing pattern 88 includes a sealing layer 90 having a plurality of hollow shapes 92 disposed on the substrate 84. As illustrated, these hollow shapes 92 have a rectangular or square shape. However, alternative embodiments of the hollow shapes 92 are triangular, or circular, or oval, or polygonal, or other suitable frame-like shapes. Examples of the sealing layer 90 include low thermally conducting materials such as glasses or polymer resins. Alternatively metals or solders may be used as the sealing layer. In certain embodiments, a preform of the sealing layer 90 having a plurality of hollow shapes 92 may be disposed on the first thermally and electrically conductive substrate 84.

Figure 9:
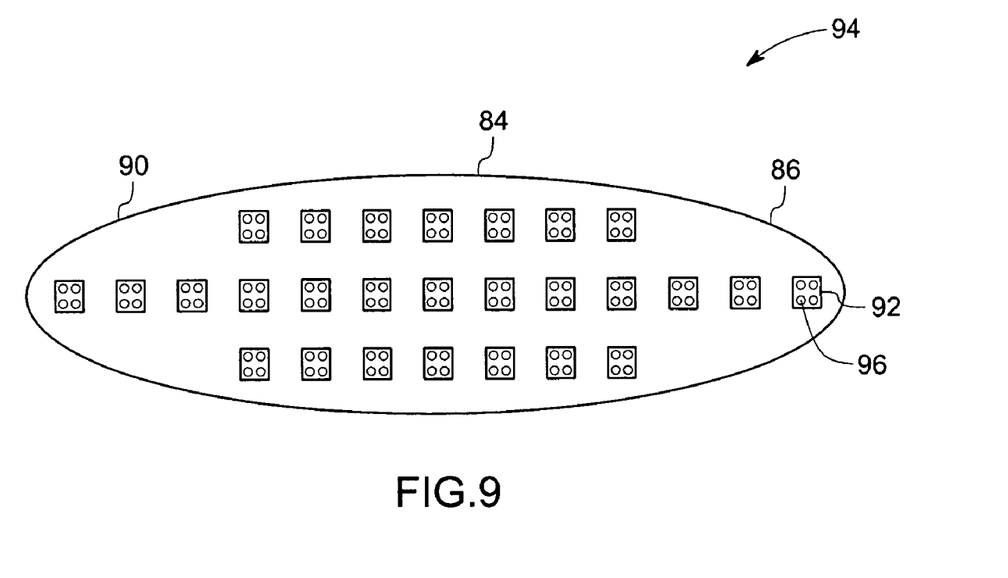
FIG. 9 is a diagrammatical top view illustrating the substrate of FIGS. 7 and 8 and a plurality of coated hollow structures disposed within the boundaries of each of the hollow shapes of FIG. 8 for use in a thermal transfer device in accordance with embodiments of the present technique.

FIG. 9 illustrates an exemplary hollow structures pattern 94 on the substrate 84 of FIGS. 7 and 8 in accordance with embodiments of the present technique. In this embodiment, a plurality of hollow structures 96 having a conductive material are disposed within the boundaries of each of the hollow shapes 92 of FIG. 8 for use in a thermal transfer device. In one embodiment, the conductive material comprises a thermally conductive material for use in a thermotunneling device. Examples of thermally conductive materials include gold and nickel.

In another embodiment, the conductive material comprises a thermoelectric material for use in a thermoelectric-base thermal transfer device. Examples of thermoelectric materials include silicon germanium, bismuth antimony, lead telluride, bismuth telluride and combinations thereof. In this embodiment, a doping level of the thermoelectric material on the hollow structures 96 is adjusted to form a p-type hollow structure 96 or an n-type hollow structure 96. Further, the thickness of the doped or coated thermoelectric material may be adjusted to provide a desired electrical conductivity while maintaining a relatively low thermal resistivity. In certain embodiments, additional layers of the thermoelectric material having stepped work functions may be deposited on the hollow structures 96. In certain other embodiments, the size of the hollow structures 96 and the thickness of the thermoelectric material may be adjusted to substantially reduce thermal transmission due to phonon transport via the thermoelectric material.

In certain other embodiments, the plurality of hollow structures having the conductive material may be disposed in a plurality of layers between the first and second thermally and electrically conductive substrates for meeting the thermal needs of an environment. Further, another electrically conductive substrate may be disposed between successive layers of the hollow structures. In certain embodiments, an electrical barrier material may be disposed on the surface of the hollow structures having the conductive material. In this embodiment, the hollow structure may include an aluminum coated hollow structure. However, other conducting material on which the electrical barrier material can be grown may be employed as the hollow structure. Examples of such materials include Tantalum, Europium, Cesium and metals coated with Cesium.

Figure 10:
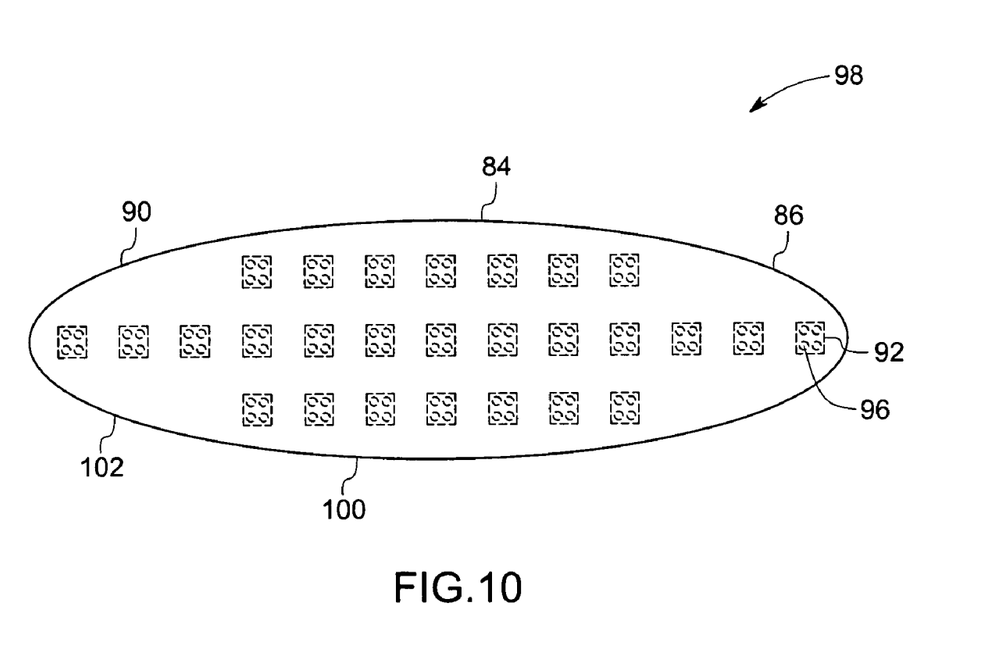
FIG. 10 is a diagrammatical top view illustrating an assembly having the substrate with the electrical barrier layer of FIG. 7, the sealing layer with the plurality of hollow shapes of FIG. 8, the plurality of coated hollow structures of FIG. 9, and a top substrate having an electrical barrier layer for use in a thermal transfer device in accordance with embodiments of the present technique.

FIG. 10 illustrates an assembly 98 having a second thermally and electrically conductive substrate 100 bonded to the first thermally and electrically conductive substrate 84 over the hollow structures pattern as illustrated above in FIG. 8. In certain embodiments, the second thermally and electrically conductive substrate 100 comprises an electrical barrier layer 102. Again, the electrical barrier layer 102 may be grown or deposited on the second thermally and electrically conductive substrate 100 by techniques such as thermal oxidation, chemical vapor deposition, enhanced plasma assisted chemical vapor deposition, sputtering, evaporation and spin coating. In certain embodiments, a low work function material may be introduced to coat the inside surfaces of the assembled device. In various embodiments, the low work function material may comprise an alkalide, an electride, a rare-earth sulfide, an oxide of barium, strontium, calcium, or combinations thereof. The bonded assembly 98 has the first and second thermally and electrically conductive substrates 84 and 100 bonded in a configuration where the first and second thermally and electrically conductive substrates 84 and 100 are positioned opposite one another. The bonded structure 98 is then cut into separate units, each unit having a plurality of the hollow structures having the thermally conductive material disposed between the first and second thermally and electrically conductive substrates 84 and 100.

Figure 11:
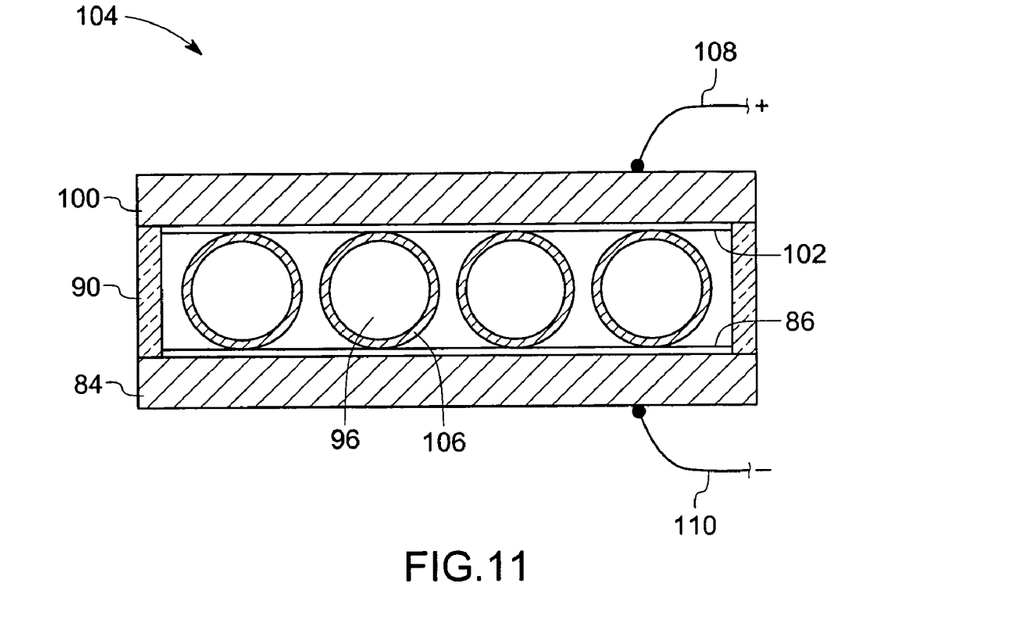
FIG. 11 is a diagrammatical side view illustrating a thermal transfer unit extracted from the assembly of FIG. 10, or alternatively assembled as an individual unit from the illustrated components, in accordance with embodiments of the present technique.

It should be noted that a plurality of units may be extracted from the foregoing bonded structure to form the thermal transfer devices of FIGS. 1, 2, 3 and 4. FIG. 11 is a side view illustrating an exemplary embodiment of the bonded structure of FIG. 10 representing a heat transfer device, e.g., a thermotunneling device or a thermoelectric device 104, which is applicable to a variety of heating, cooling and power generation systems. As illustrated, the thermal transfer device 104 includes the first thermally and electrically conductive substrate 84 and the second thermally and electrically conductive substrate 100. The thermal transfer device 104 also includes the plurality of hollow structures 96 disposed between the first and second thermally and electrically conductive substrates 84 and 100 within the sealing layer 90. In this embodiment, the hollow structures comprise a conductive material 106. Alternatively, the conductive material 106 comprises a thermoelectric material.

Further, the thermal transfer device 104 includes the electrical barrier layers 86 and 102 disposed on the first and second thermally and electrically conductive substrates 84 and 100. In certain embodiments, the electrical barrier layer 86 is disposed on the first or second thermally and electrically conductive substrates 84 and 100. The thermal transfer device 104 is coupled to an input voltage source via leads 108 and 110. In operation, the input voltage source provides a flow of current through the thermal transfer device 104, thereby creating a flow of electrons between the substrates 84 and 100. The thermal transfer device 104 may include a plurality of layers of the plurality of hollow structures 96 for meeting the thermal needs of an environment.

Figure 12:
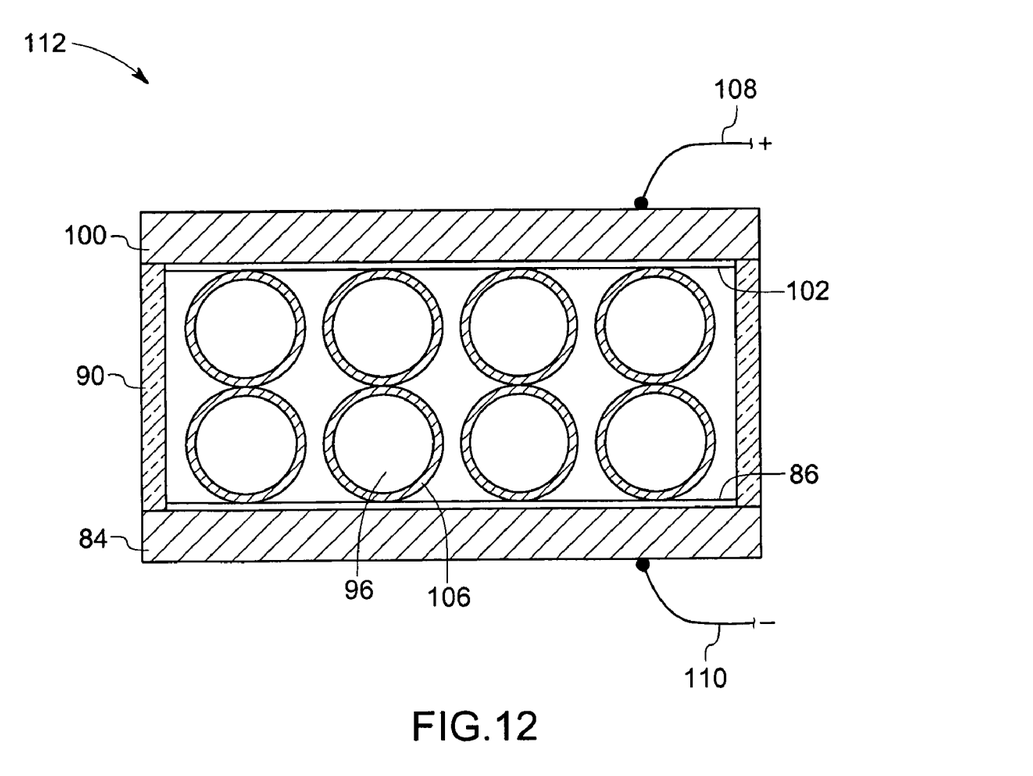
FIG. 12 is a diagrammatical side view illustrating a thermal transfer unit having two layers of coated hollow structures, such as illustrated in FIGS. 9-11, disposed between opposite substrates having electrical barrier layers in accordance with embodiments of the present technique.

FIG. 12 illustrates a thermal transfer device 112 having two layers of coated or doped hollow structures 96 in accordance with embodiments of the present technique. In this embodiment, two layers of the coated structures 96 are disposed between opposite substrates 84 and 100 having electrical barrier layers 86. Further, the hollow structures 96 may be of different size and shapes to meet the thermal needs of an environment. In this embodiment, the hollow structures include glass spheres. However, other conductive particles of other shapes are within the scope of the present technique.

Figure 13:
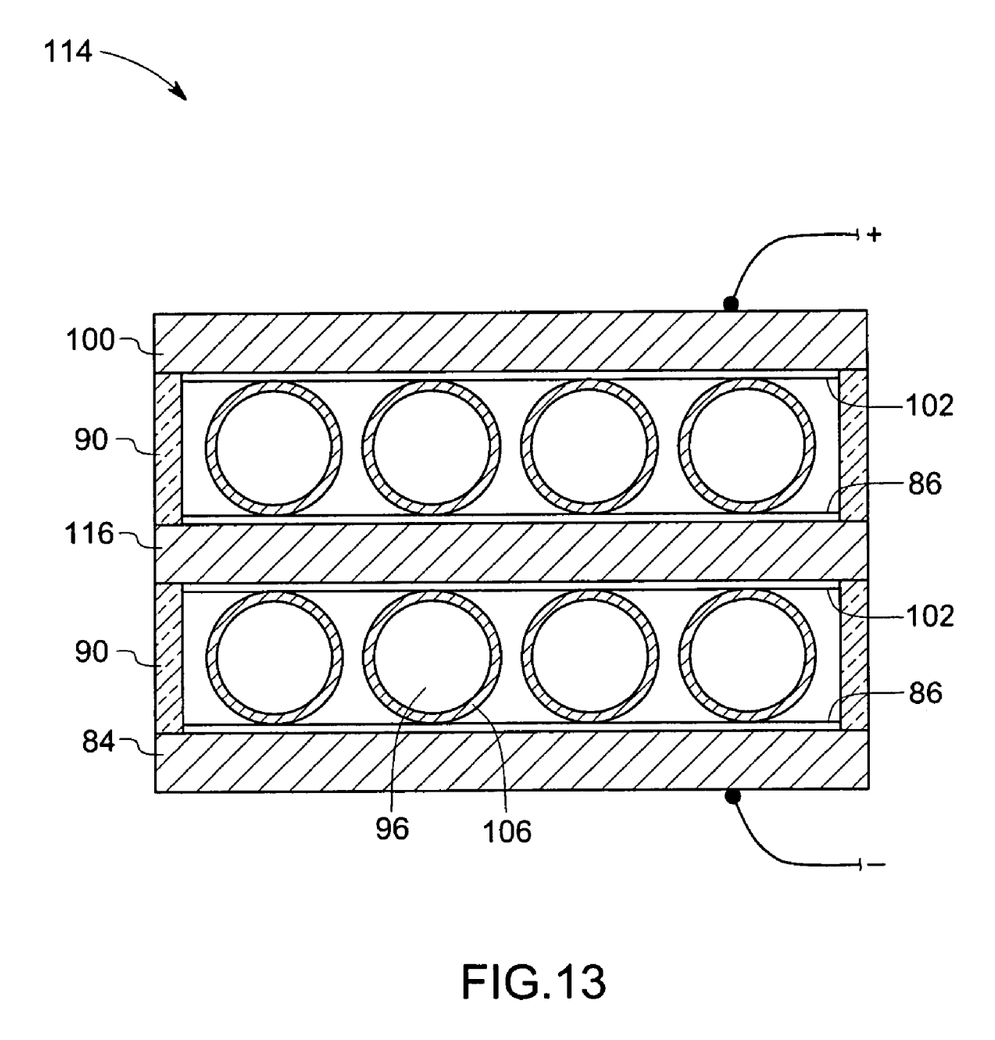
FIG. 13 is a diagrammatical side view illustrating a thermal transfer unit having a substrate between the two layers of the coated hollow structures of FIG. 12 in accordance with embodiments of the present technique.

FIG. 13 illustrates another alternate configuration 114 of the thermal transfer device 112 of FIG. 12. In this embodiment, the thermal transfer device 114 includes an additional substrate 116 disposed between the two layers of the coated hollow structures 96. However, more number of substrates forming the electrodes in the thermal transfer device 114 may be employed for managing a thermal need of an object or environment. In certain embodiments, the plurality of coated hollow structures 96 may include intermixed hollow structures 96 having different conductive materials 106. Again, the thermal transfer device 114 may include intermixed hollow structures 96 having different sizes and shapes. In addition, the thermal transfer device 114 includes the electrical barrier layer 86 on one of the substrates 84, 100 and 116 within the sealing layer 90. In certain embodiments, a doping level of the thermoelectric material on the hollow structures 96 is adjusted to form a p-type hollow structure 96 or an n-type hollow structure 96.

Figure 14:
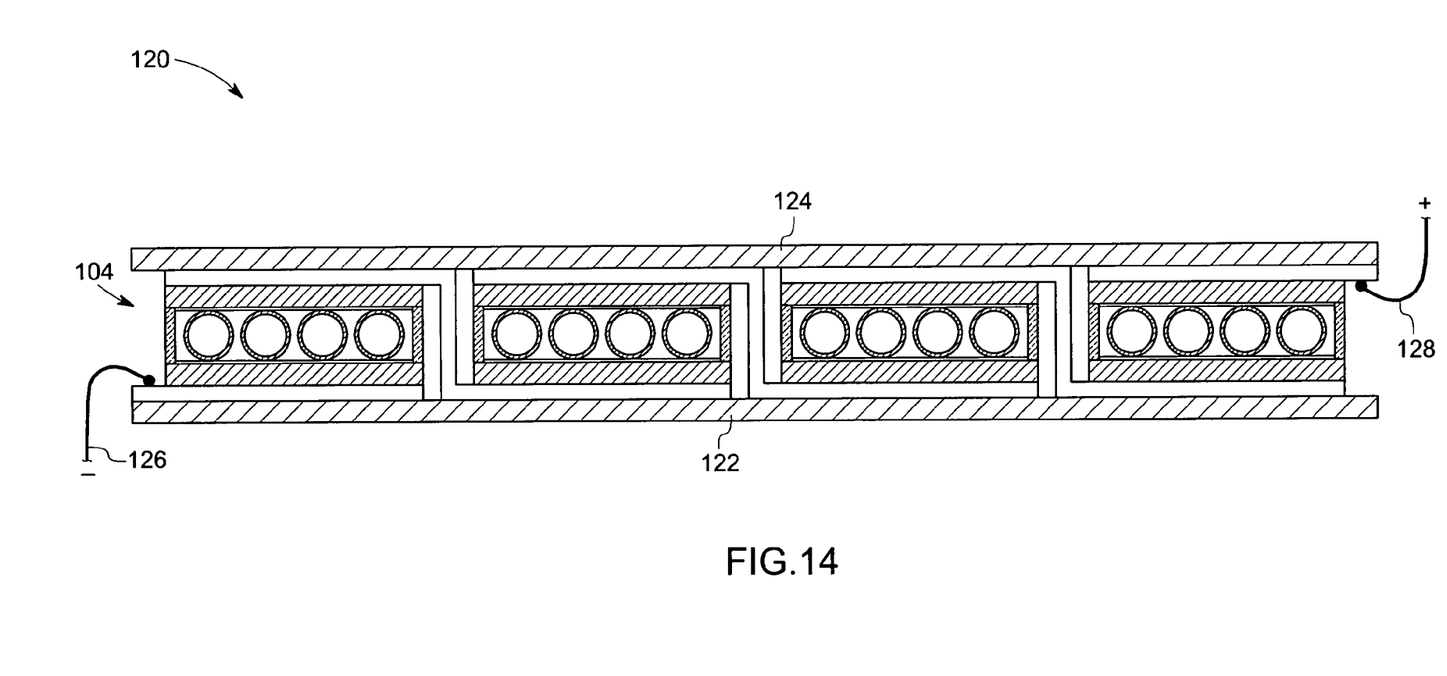
FIG. 14 is a diagrammatical side view illustrating an assembled module of a thermal transfer device having a plurality of thermal transfer units as illustrated in FIG. 11 (each unit extracted from the assembly of FIG. 10 or alternatively assembled as an individual unit from the illustrated components of FIG. 10) in accordance with embodiments of the present technique.

FIG. 14 illustrates a cross-sectional side view of a thermal transfer device or an assembled module 120 having a plurality of thermal transfer devices 104 in accordance with embodiments of the present technique. In the illustrated embodiment, the extracted units 104 or the thermal transfer devices 104 are mounted between opposite substrates 122 and 124 and are electrically coupled to create the assembled module 120. In certain embodiments, the thermal transfer devices 104 are coupled in parallel to provide redundancy and/or additional thermal transfer capabilities. For example, if one of the plurality of thermal transfer devices 104 fails, then the other devices 104 ensure that sufficient heat transfer is provided despite the failure. In certain embodiments, the thermal transfer module 120 includes alternating p-type 104 and n-type legs 104 to provide a desired heating or cooling capacity based on certain thermal management needs. In this manner, the thermal transfer devices 104 cooperatively provide a desired heating or cooling capacity, which can be used to transfer heat from one object or area to another. In certain embodiments, the plurality of thermotunneling devices 104 may be coupled via a conductive adhesive, such as silver filled epoxy or a solder alloy. The conductive adhesive or the solder alloy for coupling the plurality of thermal transfer devices 104 may be selected based upon a desired processing technique and a desired operating temperature of the thermal transfer device. Finally, the assembled module 120 is coupled to an input voltage source via leads 126 and 128. In operation, the input voltage source provides a flow of current through the thermal transfer devices 104, thereby creating a flow of electrons via the thermotunneling or thermoelectric mechanism between the substrates 122 and 124. As a result of this flow of electrons, the thermal transfer devices 104 facilitate heat transfer between the substrates 122 and 124.

Figure 15:
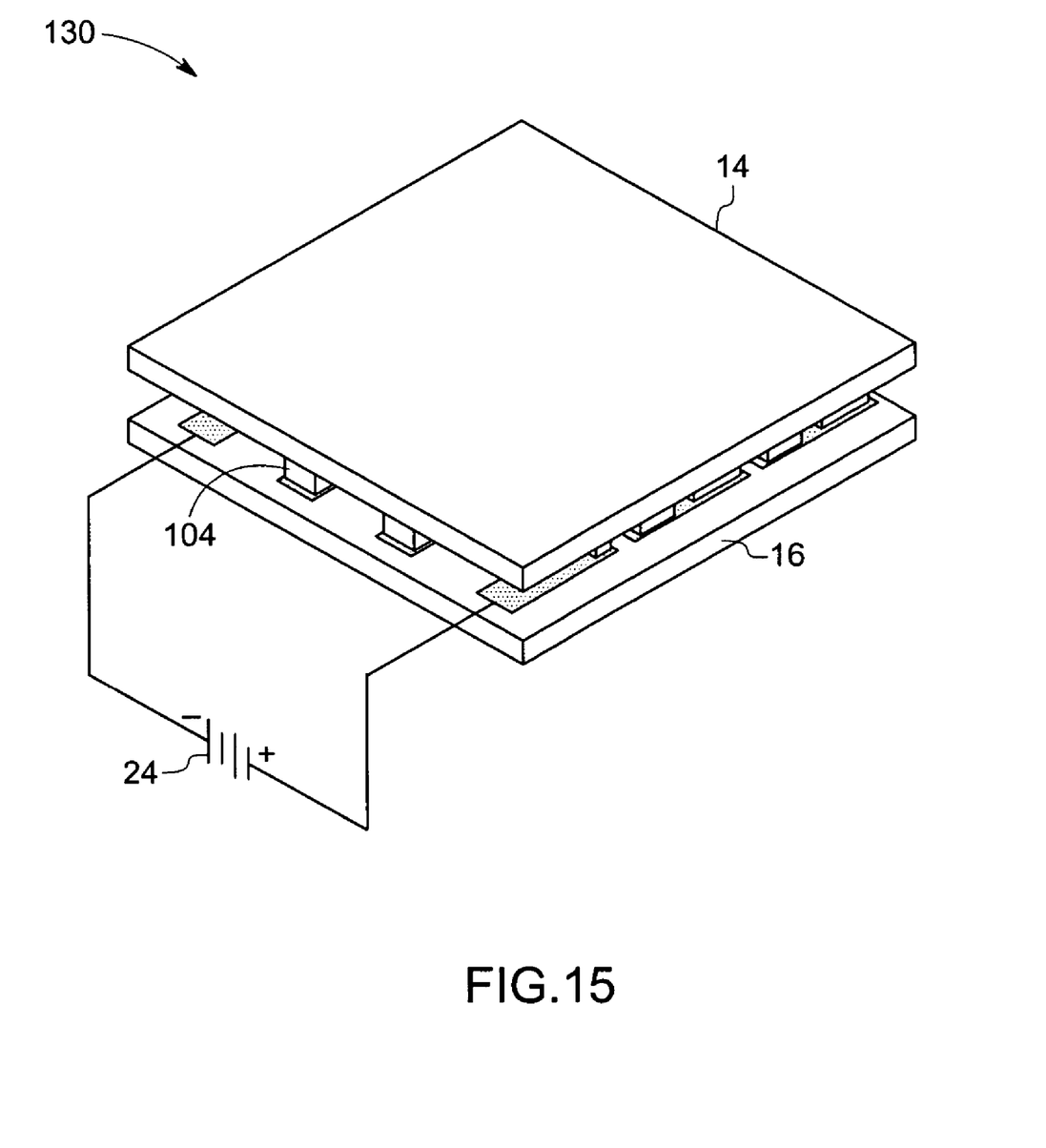
FIG. 15 is a perspective view illustrating a module having an array of thermal transfer devices in accordance with embodiments of the present technique.

FIG. 15 illustrates a perspective view of a thermal transfer module 130 having an array of thermal transfer devices 104 in accordance with embodiments of the present technique. In this embodiment, the thermal transfer devices 104 are employed in a two-dimension array to meet a thermal management need of an environment or application. The thermal transfer devices 104 may be assembled into the heat transfer module 130, where the devices 104 are coupled electrically in series and thermally in parallel to enable the flow of electrons from first object 14 in the module 130 to the second object 16 in the module 130, thus transferring the heat from the first object 14 to the second object 16.

The various aspects of the techniques described above find utility in a variety of heating/cooling systems, such as refrigeration, air conditioning, electronics cooling, industrial temperature control, power generation, and so forth. These include air conditioners, water coolers, refrigerators, heat sinks, climate control seats, and so forth. The thermal transfer devices as described above may be employed in refrigeration systems such as for household refrigeration and industrial refrigeration. In addition, such thermal transfer devices may be employed for cryogenic refrigeration, such as for liquefied natural gas (LNG) or superconducting devices. Further, the thermal transfer device may be employed in systems for ventilation and air conditioning. Examples of such systems include air conditioners and dehumidifiers. In addition, the thermal transfer devices may be employed for power generation and/or waste heat recovery in different applications by maintaining a thermal gradient between two electrodes. Examples of such applications include gas turbine exhausts, furnace exhausts, exhausts of vehicles, and so forth.

The passive thermal transfer devices described above may also be employed for thermal energy conversion and for thermal management. It should be noted that the materials and the manufacturing techniques for the thermal transfer device may be selected based upon a desired thermal management need of an object. Such devices may be used for cooling of microelectronic systems such as microprocessor and integrated circuits. Further, the thermal transfer devices may be employed for thermal management of semiconductors, photonic devices, and infrared sensors.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A solid state thermal transfer device, comprising:
first and second electrically conductive substrates that are positioned opposite from one another;
a sealing layer disposed between the first and second electrically conductive substrates; and
a plurality of hollow structures having a conductive material, wherein the plurality of hollow structures is contained by the sealing layer between the first and second electrically conductive substrates,
wherein the sealing layer comprises a plurality of hollow shapes, and multiple hollow structures are disposed within each of the plurality of hollow shapes between the first and second electrically conductive substrates.

2. The solid state thermal transfer device of claim 1, wherein the hollow structures comprise a coating of the conductive material.

3. The solid state thermal transfer device of claim 2, wherein the hollow structures comprise hollow glass spheres.

4. The solid state thermal transfer device of claim 1, wherein the conductive material comprises an electrically conductive material or a thermoelectric material.

5. The solid state thermal transfer device of claim 1, further comprising an electrical barrier layer disposed between the first and second electrically conductive substrates on the first or second electrically conductive substrates.

6. The solid state thermal transfer device of claim 1, wherein the plurality of hollow structures are disposed in a plurality of layers between the first and second electrically conductive substrates.

7. The solid state thermal transfer device of claim 6, further comprising another electrically conductive substrate disposed between successive layers of the plurality of layers of the hollow structures.

8. The solid state thermal transfer device of claim 1, wherein the device is configured to generate power by substantially maintaining a temperature gradient between the first and second electrically conductive substrates.

9. The solid state thermal transfer device of claim 1, wherein introduction of current flow between the first and second electrically conductive substrates enables heat transfer between the first and second electrically conductive substrates via a flow of electrons though the plurality of hollow structures between the first and second electrically conductive substrates.

10. The solid state thermal transfer device of claim 9, wherein the thermal transfer device is configured to cool a refrigeration system or an air conditioning system or a microelectronic system.

11. The solid state thermal transfer device of claim 1, wherein the sealing layer comprises glasses, or thermoplastics, or polymer resins, or metals, or solders.

12. The solid state thermal transfer device of claim 1, wherein the conductive material comprises a thermoelectric material including silicon germanium, or bismuth antimony, or lead telluride, or bismuth telluride, or any combination thereof.

13. The solid state thermal transfer device of claim 1, wherein the plurality of hollow structures comprises deformed hollow structures configured to provide a substantially high conductivity of the device.

14. A solid state thermal transfer device, comprising:
first and second thermally and electrically conductive substrates that are positioned opposite from one another, wherein the first and second thermally and electrically conductive substrates are each substantially flat;
an electrical barrier layer disposed between the first and second thermally and electrically conductive substrates on the first or second thermally and electrically conductive substrates;
a sealing layer disposed between the first and second thermally and electrically conductive substrates; and
a plurality of hollow structures having an electrically conductive material, wherein the plurality of hollow structures is contained by the sealing layer between the first and second thermally and electrically conductive substrates,
wherein the sealing layer comprises a plurality of hollow shapes, and multiple hollow structures are disposed within each of the plurality of hollow shapes between the first and second thermally and electrically conductive substrates.

15. The solid state thermal transfer device of claim 14, wherein the first or second thermally and electrically conductive substrate comprises a doped n-type silicon wafer or a doped p-type silicon wafer.

16. The solid state thermal transfer device of claim 14, wherein the electrical barrier layer comprises an oxide, or a nitride, or a silica-based aerogel, or a polymer, or any combination thereof.

17. The solid state thermal transfer device of claim 14, further comprising a low work function material disposed on the electrical barrier layer.

18. The solid state thermal transfer device of claim 14, wherein the device is configured to cool, or to heat, or to generate power.

* * * * *

UNITED STATES PATENT AND TRADEMARK OFFICE
CERTIFICATE OF CORRECTION

| | | |
|---|---|---|
| PATENT NO. | : 7,498,507 B2 | Page 1 of 1 |
| APPLICATION NO. | : 11/081986 | |
| DATED | : March 3, 2009 | |
| INVENTOR(S) | : Weaver, Jr. et al. | |

It is certified that error appears in the above-identified patent and that said Letters Patent is hereby corrected as shown below:

Title page, on Page 2, in Item (56), under "U.S. PATENT DOCUMENTS", in Column 2, Line 5, delete "428/237" and insert -- 438/237 --, therefor.

In Column 13, Line 13, in Claim 9, delete "though" and insert -- through --, therefor.

Signed and Sealed this

Twenty-eighth Day of April, 2009

JOHN DOLL
*Acting Director of the United States Patent and Trademark Office*